US009269669B2

(12) United States Patent
Helneder et al.

(10) Patent No.: US 9,269,669 B2
(45) Date of Patent: Feb. 23, 2016

(54) PROCESS FOR PRODUCING A MULTIFUNCTIONAL DIELECTRIC LAYER ON A SUBSTRATE

(75) Inventors: Johann Helneder, Landsham (DE); Markus Schwerd, Hoehenkirchen (DE); Thomas Goebel, Bejing (CN); Andrea Mitchell, Munich (DE); Heinrich Koerner, Bruckmuehl (DE); Martina Hommel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/402,890

(22) Filed: Feb. 23, 2012

(65) Prior Publication Data

US 2012/0149168 A1 Jun. 14, 2012

Related U.S. Application Data

(63) Continuation of application No. 11/386,075, filed on Mar. 21, 2003, now abandoned, which is a continuation of application No. PCT/DE2004/001948, filed on Sep. 3, 2004.

(51) Int. Cl.
| | |
|---|---|
| *C23C 14/00* | (2006.01) |
| *H01L 23/532* | (2006.01) |
| *C23C 14/22* | (2006.01) |
| *C23C 16/44* | (2006.01) |
| *H01L 21/768* | (2006.01) |
| *H01L 23/522* | (2006.01) |

(52) U.S. Cl.
CPC .......... *H01L 23/53238* (2013.01); *C23C 14/22* (2013.01); *C23C 16/44* (2013.01); *H01L 21/76834* (2013.01); *H01L 21/76888* (2013.01); *H01L 23/5228* (2013.01); *H01L 23/53223* (2013.01)

(58) Field of Classification Search
USPC ............ 427/97.1–97.4, 97.7, 98.4, 99.3, 539, 427/576; 438/382, 627
See application file for complete search history.

(56) References Cited

U.S. PATENT DOCUMENTS

| | | | |
|---|---|---|---|
| 3,663,279 A | 5/1972 | Lepselter | |
| 3,832,230 A * | 8/1974 | Terry | 438/598 |
| 4,458,295 A * | 7/1984 | Durschlag et al. | 361/322 |
| 4,460,938 A * | 7/1984 | Clei | 361/779 |
| 5,783,483 A | 7/1998 | Gardner | |
| 6,426,306 B1 | 7/2002 | Deboer et al. | |
| 6,461,914 B1 | 10/2002 | Roberts et al. | |
| 6,498,714 B1 | 12/2002 | Fujisawa et al. | |
| 6,534,374 B2 * | 3/2003 | Johnson et al. | 438/381 |
| 6,709,918 B1 * | 3/2004 | Ng et al. | 438/253 |
| 6,730,573 B1 * | 5/2004 | Ng et al. | 438/381 |
| 2002/0086522 A1 * | 7/2002 | Lu et al. | 438/635 |

(Continued)

FOREIGN PATENT DOCUMENTS

| | | | |
|---|---|---|---|
| JP | 08293494 A | 11/1996 | |
| JP | 1168048 A | 3/1999 | |

(Continued)

*Primary Examiner* — Brian K Talbot
(74) *Attorney, Agent, or Firm* — Slater & Matsil, L.L.P.

(57) ABSTRACT

A multifunctional dielectric layer can be formed on a substrate, especially on an exposed metallic strip conductor system on a substrate. An additional metal layer is formed across the surface of the exposed metal strip conductors. The metal layer is then at least partially converted to a nonconducting metal oxide, the dielectric layer.

18 Claims, 2 Drawing Sheets

(56) References Cited

U.S. PATENT DOCUMENTS

| | | |
|---|---|---|
| 2002/0119622 A1 | 8/2002 | Steigerwald et al. |
| 2003/0017699 A1 | 1/2003 | Zurcher et al. |
| 2003/0088978 A1* | 5/2003 | Takano et al. .................. 29/846 |
| 2004/0238964 A1* | 12/2004 | Kawano et al. ............... 257/758 |
| 2004/0258833 A1* | 12/2004 | Kamata et al. ................ 427/130 |
| 2005/0215178 A1* | 9/2005 | Dornfeld et al. .................. 451/5 |

FOREIGN PATENT DOCUMENTS

| | | |
|---|---|---|
| JP | 1107636 A | 11/1999 |
| JP | 2003031654 A | 1/2003 |
| JP | 2003324157 A | 11/2003 |
| JP | 2004507105 A | 3/2004 |
| JP | 2005526378 A | 9/2005 |

* cited by examiner

PROCESS FOR PRODUCING A MULTIFUNCTIONAL DIELECTRIC LAYER ON A SUBSTRATE

The application is a continuation application of U.S. patent application Ser. No. 11/386,075, filed on Mar. 21, 2006, which is a continuation of International Application No. PCT/DE2004/001948, filed Sep. 3, 2004, which designated the United States and was not published in English, and which is based on German Application No. 103 44 389.4, filed Sep. 25, 2003. U.S. patent application Ser. No. 11/386,075 is hereby incorporated by reference herein. International Application No. PCT/DE2004/001948 is hereby incorporated by reference herein. German Application No. 103 44 389.4 is hereby incorporated by reference herein.

TECHNICAL FIELD

The invention relates to a process for producing a multifunctional dielectric layer on a substrate, in particular on uncovered metallic interconnect systems on a substrate.

BACKGROUND

In the semiconductor components that have been disclosed to date, based on Si substrates, it is predominantly copper interconnects that are responsible for the electrical contact-connection of the individual functional layers or functional elements of a level and also between the levels. A particular problem that has emerged with the use of copper interconnects is that Cu atoms can diffuse into the surrounding dielectric and can, therefore, alter the electrical properties of the semiconductor component, even to the extent of rendering it unable to function.

Of course, other substrates, such as glass, GaAs, InP, circuit boards, printed wiring boards, etc., can also be considered as substrates in addition to Si substrates.

To prevent Cu atoms from diffusing into the dielectric, it is customary to use diffusion barriers, which are introduced at the side walls of the Cu interconnects, i.e., are introduced between the Cu interconnect and the surrounding dielectric ($SiO_2$) and consist, for example, of Ta(N). The term Ta(N) used below is in the present context to be understood as meaning a compound with any desired stoichiometry comprising tantalum and any desired proportion of nitrogen. This ensures sufficient protection against diffusion.

However, since the copper layer is uncovered at the top following the patterning of the copper interconnects by means of the standard CMP (chemical mechanical polishing) processing, this copper layer has to be passivated in order to prevent any oxidation. This is achieved by the uncovered interconnect surface (Cu layer) being provided with a suitable dielectric layer, e.g., SiN-PECVD layer.

However, drawbacks of this interface are the weak point in terms of electromigration and stress migration, and the fact that the bonding is less than optimum. By way of example, selective deposition of cobalt on the uncovered metal surfaces by means of electroless electrolysis processes has been attempted with a view to achieving an improvement in this respect, but this has not to date led to the desired level of success.

SUMMARY OF THE INVENTION

The invention is now based on the object of providing a process that is simple to implement for the production of a multifunctional passivation layer for copper interconnects with improved electromigration and stress migration and improved bonding of the applied dielectric layer.

The object on which the invention is based is achieved, in a process of the type described in the introduction, by virtue of the fact that a further metal layer is deposited over the entire surface of the uncovered metal interconnects, and this further metal layer is then at least partially converted into a nonconducting metal oxide, i.e., into an insulator.

It is in this way possible to achieve significantly improved bonding of the dielectric layer to the metal interconnect, in particular to the Cu layer, and an improved electromigration and stress migration.

In a first configuration of the invention, the metal interconnects have been embedded in an insulator on a substrate and have been provided with a diffusion barrier at the side walls. The further metal layer was applied to the uncovered metal interconnect, which may consist of copper, after the chemical mechanical polishing (CMP).

In a second configuration of the invention, the metal interconnects have a subtractive architecture, by virtue of the fact that a metal layer, which has been deposited over the entire surface of an insulator on the substrate, has been subsequently patterned, for example by RIE (reactive ion etching) or a lift-off process or the like, and the further metal layer has been deposited thereon. The metal interconnects in this case consist of, for example, aluminum.

A third configuration of the invention is characterized in that the further metal layer is applied to metal interconnects that have been produced by "pattern plating" (i.e., electrolytic deposition of metal into a resist mask and subsequent removal of the resist mask) on an insulator on the substrate.

It is expedient for the further metal layer to be converted into a nonconducting metal oxide by anodic, thermal or plasma-chemical oxidation in a back-end-compatible temperature range between 20-500° C.

In one particular configuration of the invention, the further metal layer is produced by a PVD process.

It is preferable to deposit tantalum or tantalum nitride.

According to a further configuration of the invention, a layer sequence of Ta(N)/Ta or Ta/Ta(N) is deposited. Further materials and material combinations, such as Ti, Al, Ti/Al, Zr, Hf, Nb, Ru, Rh, Ir, are possible.

Finally, it is provided that during the subsequent oxidation a nonconducting metal oxide layer is produced, for example from tantalum pentoxide ($Ta_2O_5$) when using Ta(N), the aim being to achieve a higher density and quality of the layer, good bonding and a clear, defined interface.

In a variant of the invention, it is possible to remove regions of the further metal layer during the subsequent oxidation, so that at this location a resistor made from Ta(N) is formed and is contact-connected via the metal layer (e.g., Cu) below.

It is preferable for parts of the further metal layer to be covered with an $SiO_2$ or $Si_3N_4$ layer.

Finally, in a further configuration of the invention, it is provided that the tantalum pentoxide is formed partly as a MIM dielectric for integration of a MIM capacitor.

The Ta(N) resistor and the MIM capacitor can be integrated individually or simultaneously.

BRIEF DESCRIPTION OF THE DRAWINGS

The invention is to be explained in more detail below on the basis of an exemplary embodiment using Ta(N). In the associated drawings.

The following list of reference symbols can be used in conjunction with the figures:

| | |
|---|---|
| 1 | Substrate |
| 2 | $SiO_2$ |
| 3 | Cu metallization/metal interconnect |
| 4 | Through-contacts |
| 5 | Further metal layer |
| 6 | SiN layer |
| 7 | Metal oxide |
| 8 | Ta(N) resistor |
| 9 | MIM capacitor |

DETAILED DESCRIPTION OF ILLUSTRATIVE EMBODIMENTS

Figure 1:
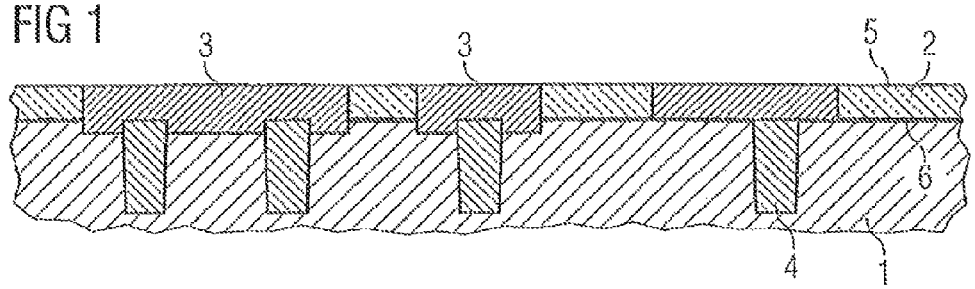
FIG. 1 shows a Cu level located on a substrate following the CMP, and a PVD-Ta(N) layer deposited thereon as further metal layer.

FIG. 1 shows a substrate 1, for example made from silicon, with a Cu metallization 3, which has been embedded in an $SiO_2$ layer 2 (Damascene) and has been electrically connected to a lower-lying Cu level via through-contacts 4 made from Cu or another metal, such as tungsten. The uncovered Cu metallization 3, following a CMP (chemical mechanical polishing) process, has been covered with a further metal layer 5, e.g., a Ta(N) layer, by a PVD process. The bonding of a PVD-Ta(N) metal layer is generally better than when using layer systems that have been produced using CVD processes, since, for example, undesirable chemical processes at the interfaces are eliminated in the PVD process and the kinetic energy of the sputtered particles is higher when they first strike the surface on which they are to be deposited.

The boundary layer, which is in this case produced, corresponds to the surrounding barrier and means that a comparable resistance to electromigration can be expected. Beneath the Cu metallization 3 there is also an optional SiN layer 6 as a diffusion barrier and etching stop layer.

The deposition of, for example, PVD Ta, PVD Ta(N), PVD Ta(N)/Ta, PVD Ta/Ta(N) or other materials and material combinations, such as Ti, Al, Ti/Al, Zr, Hf, Nb, Ru, Rh, Ir, is suitable for the further metal layer 5. However, since this further metal layer 5, as a metallic covering layer, would short-circuit all the interconnects in this level, this layer is completely converted into a nonconducting layer of a metal oxide 7, such as for example tantalum pentoxide. This can easily be achieved for example by thermal oxidation, which can take place in a back-end-compatible temperature range between 20 and 500° C.

Figure 2:
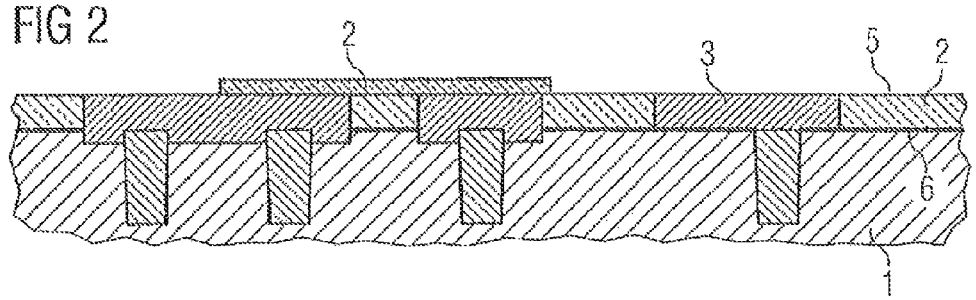
FIG. 2 shows the substrate from FIG. 1 following the deposition of a delimited $SiO_2$ layer on the Ta(N) layer.

The above-mentioned materials are in this case converted into a corresponding metal oxide, i.e., a dielectric, such as for example $Ta_2O_5$, $Al_2O_3$, $HfO_2$, $Nb_2O_5$, $RuO_2$, $Rh_2O_3$, $Ir_2O_3$, etc. (FIG. 2).

Figure 3:
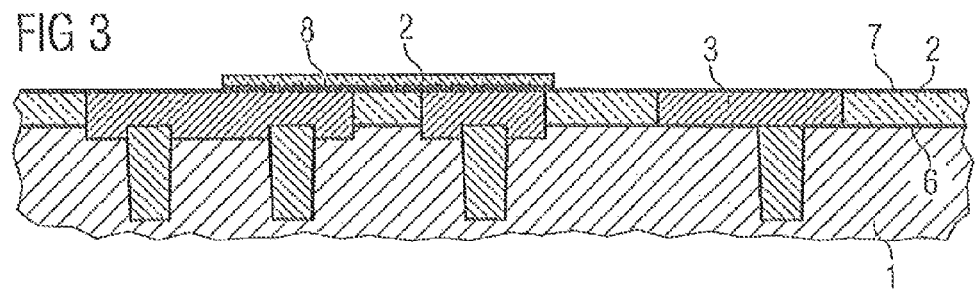
FIG. 3 shows the substrate following the oxidation of the free Ta(N) layer to form tantalum pentoxide, with the layer of the Ta(N) layer that has been covered with $SiO_2$ remaining unchanged and subsequently forming a Ta(N) resistor.

However, if for example a Ta(N) resistor 8 (TFR resistor) is to be produced between two through-contacts 4, the corresponding region of the further metal layer 5 is covered with $SiO_2$ prior to the oxidation (FIG. 3).

Figure 4:
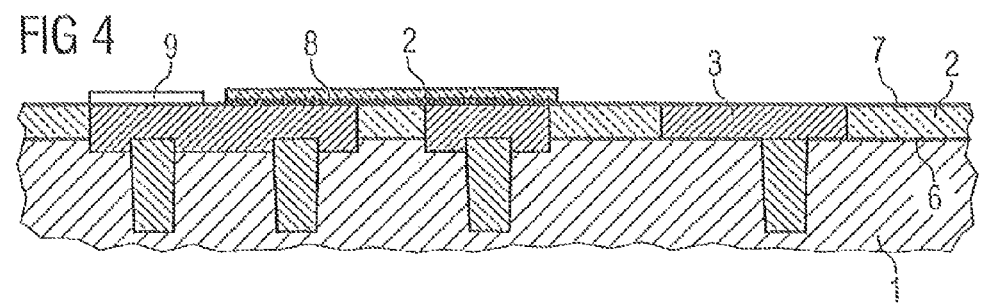
FIG. 4 shows the substrate following the deposition of a further metal layer and patterning of the latter to form the upper electrode of a MIM capacitor together with a Ta(N) resistor, which has previously been produced.
Figure 5:
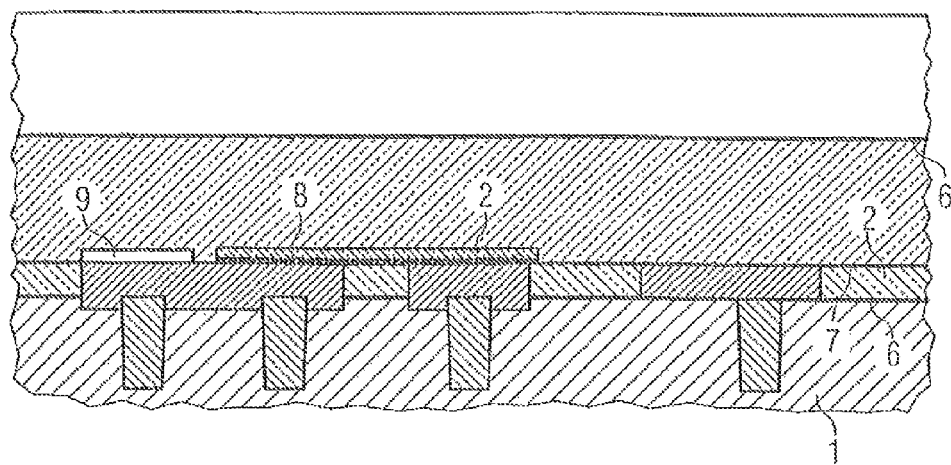
FIG. 5 shows the substrate following the deposition of a further $SiO_2$ layer, which serves as an intermetal dielectric.

Another option is to use and integrate anodically/thermally oxidized Ta/N for MIM capacitors 9 (MIM=metal, insulator, metal). To achieve this, the Ta(N), which has been deposited over a large area, is not protected in the region where the MIM capacitor is to be formed, so that this region is oxidized to form $Ta_2O_5$ and serves as dielectric for the MIM capacitor (FIGS. 4, 5).

Figure 6:
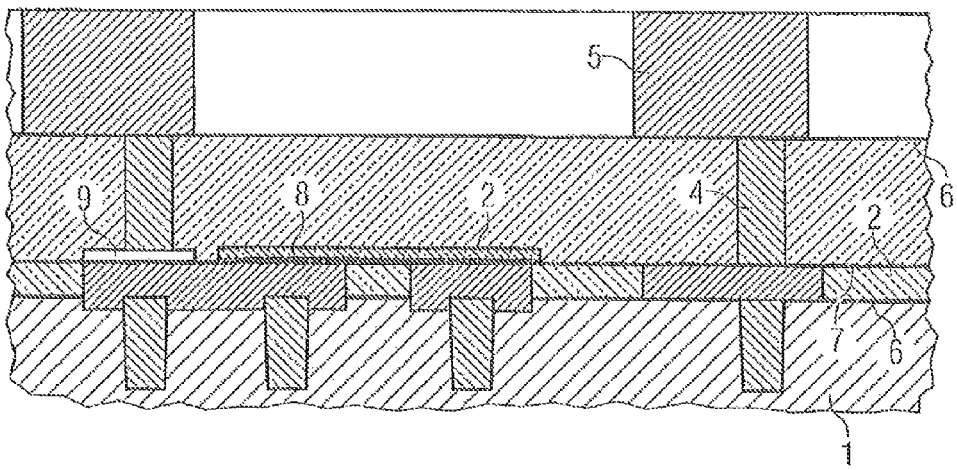
FIG. 6 shows the substrate after processing of a further interconnect level and of through-contacts between the two levels.

FIG. 6 shows a Cu level that has been passivated with tantalum pentoxide and includes a Ta(N) resistor 8 and a MIM capacitor 9 with $Ta_2O_5$ as dielectric.

The invention makes it possible to produce a significantly improved barrier interface for metallic interconnect systems by means of a metallic coating, which is substantially completely oxidized in the following process, so as to form a nonconducting metal oxide.

The underlying idea of the invention is in converting an applied metal layer (further metal layer 5) into a dielectric (metal oxide 7) and using the dielectric layer produced in this way for various applications (passivation, stop layer, MIM dielectric, etc.).

$Al_2O_3$, $HfO_2$, $Nb_2O_5$, etc. can also be used as MIM dielectric.

What is claimed is:

1. A method for forming a device, the process comprising:
depositing a resist layer over an insulator on a substrate;
forming openings for metal interconnects in the resist layer;
forming a first metal interconnect in a first region, a second metal interconnect and a third metal interconnect in a second region, and a fourth metal interconnect in a third region, by depositing a metal comprising copper within the openings using a pattern plating process;
removing the resist layer after depositing the metal;
forming a further metal layer comprising a further metal as a blanket layer over the substrate using a plasma vapor deposition process over and contacting the metal comprising copper, the further metal comprising a material selected from Ti, Hf, Nb, Zr, Ru, Rh, and Ir;
forming a silicon oxide or silicon nitride layer covering the further metal layer in the second region;
converting all of the further metal layer in the first region and the third region to form an oxide of the further metal layer without converting the underlying metal comprising copper;
forming a silicon nitride layer over the first, the second, the third, and the fourth metal interconnects, the silicon nitride layer covering the oxide of the further metal layer in the first region, the silicon oxide or silicon nitride layer in the second region;
forming a first metal via within the silicon nitride layer, the first metal via contacting the oxide of the further metal layer in the first region;
forming a second metal via within the silicon nitride layer, the second metal via contacting the fourth metal interconnect in the third region; and
forming a fifth metal interconnect and a sixth metal interconnect over and contacting the silicon nitride layer, wherein the fifth metal interconnect contacts the first metal via and the sixth metal interconnect contacts the second metal via, wherein the first metal interconnect, the oxide of the further metal layer in the first region, and the first metal via form a MIM capacitor, wherein the further metal layer covered by the silicon oxide or silicon nitride layer in the second region forms a resistor, and wherein the second metal via forms an electrical contact to the fourth metal interconnect.

2. The method of claim 1, wherein the fifth metal interconnect and the sixth metal interconnect comprise the further metal.

3. The method of claim 1, wherein converting all of the further metal layer comprises using a plasma-chemical oxidation process.

4. The method of claim 1, wherein converting all of the further metal layer comprises using an anodic oxidation process.

5. The method of claim 1, wherein converting all of the further metal layer comprises using a thermal oxidation process.

6. A method for forming a device, the process comprising:
forming a first metal interconnect in a first region, a second metal interconnect and a third metal interconnect in a second region, and a fourth metal interconnect in a third region, by depositing a metal comprising copper using a damascene process, wherein the first, the second, the third, and the fourth metal interconnects are embedded in an insulator over a substrate and provided with a diffusion barrier at sidewalls of the first, the second, the third, and the fourth metal interconnects;
forming a further metal layer comprising a further metal as a blanket layer over the substrate using a plasma vapor deposition process, the further metal layer contacting the metal comprising copper, the further metal comprising a material selected from Ti, Hf, Nb, Zr, Ru, Rh, and Ir;
forming a silicon oxide or silicon nitride layer covering the further metal layer in the second region;
converting all of the further metal layer in the first region and the third region to form an oxide of the further metal layer without converting the underlying metal comprising copper;
forming a silicon nitride layer over the first, the second, the third, and the fourth metal interconnects, the silicon nitride layer covering the oxide of the further metal layer in the first region, the silicon oxide or silicon nitride layer in the second region;
forming a first metal via within the silicon nitride layer, the first metal via contacting the oxide of the further metal layer in the first region;
forming a second metal via within the silicon nitride layer, the second metal via contacting the fourth metal interconnect in the third region; and
forming a fifth metal interconnect and a sixth metal interconnect over and contacting the silicon nitride layer, wherein the fifth metal interconnect contacts the first metal via and the sixth metal interconnect contacts the second metal via, wherein the first metal interconnect, the oxide of the further metal layer in the first region, and the first metal via form a MIM capacitor, wherein the further metal layer covered by the silicon oxide or silicon nitride layer in the second region forms a resistor, and wherein the second metal via forms an electrical contact to the fourth metal interconnect.

7. The method of claim 6, wherein the fifth metal interconnect and the sixth metal interconnect comprise the further metal.

8. The method of claim 6, wherein converting all of the further metal layer comprises using a plasma-chemical oxidation process.

9. The method of claim 6, wherein converting all of the further metal layer comprises using an anodic oxidation process.

10. The method of claim 6, wherein converting all of the further metal layer comprises using a thermal oxidation process.

11. A method for forming a device, the process comprising:
forming a first metal interconnect in a first region, a second metal interconnect and a third metal interconnect in a second region, and a fourth metal interconnect in a third region, by depositing a blanket metal layer comprising aluminum over an entire surface of an insulator over a substrate and patterning the blanket metal layer;
forming a further metal layer comprising a further metal as a blanket layer over the substrate using a plasma vapor deposition process, the further metal layer contacting the metal comprising copper, the further metal comprising a material selected from Ti, Hf, Nb, Zr, Ru, Rh, and Ir;
forming a silicon oxide or silicon nitride layer covering the further metal layer in the second region;
converting all of the further metal layer in the first region and the third region to form an oxide of the further metal layer without converting the underlying metal comprising copper;
forming a silicon nitride layer over the first, the second, the third, and the fourth metal interconnects, the silicon nitride layer covering the oxide of the further metal layer in the first region, the silicon oxide or silicon nitride layer in the second region;
forming a first metal via within the silicon nitride layer, the first metal via contacting the oxide of the further metal layer in the first region;
forming a second metal via within the silicon nitride layer, the second metal via contacting the fourth metal interconnect in the third region; and
forming a fifth metal interconnect and a sixth metal interconnect over and contacting the silicon nitride layer, wherein the fifth metal interconnect contacts the first metal via and the sixth metal interconnect contacts the second metal via, wherein the first metal interconnect, the oxide of the further metal layer in the first region, and the first metal via form a MIM capacitor, wherein the further metal layer covered by the silicon oxide or silicon nitride layer in the second region forms a resistor, and wherein the second metal via forms an electrical contact to the fourth metal interconnect.

12. The method of claim 11, wherein the fifth metal interconnect and the sixth metal interconnect comprise the further metal.

13. The method of claim 11, wherein converting all of the further metal layer comprises using a plasma-chemical oxidation process.

14. The method of claim 11, wherein converting all of the further metal layer comprises using an anodic oxidation process.

15. The method of claim 11, wherein converting all of the further metal layer comprises using a thermal oxidation process.

16. A method for forming a device, the process comprising:
forming a first metal interconnect in a first region, a second metal interconnect and a third metal interconnect in a second region, and a fourth metal interconnect in a third region, by depositing a metal comprising copper using a damascene process, wherein the first, the second, the third, and the fourth metal interconnects are embedded in an insulator over a substrate and provided with a diffusion barrier at sidewalls of the first, the second, the third, and the fourth metal interconnects;

forming a further metal layer comprising a further metal as a blanket layer over the substrate using a plasma vapor deposition process, the further metal layer contacting the metal comprising copper, the further metal comprising a material selected from Ti, Hf, Nb, Zr, Ru, Rh, and Ir; and converting all of the further metal layer in the first region and the third region to form an oxide of the further metal layer without converting the further metal layer in the second region without converting the underlying metal comprising copper.

17. The method of claim 16, further comprising:

forming an insulator layer over the first, the second, the third, and the fourth metal interconnects, the insulator layer covering the oxide of the further metal layer in the first region;

forming a first metal via within the insulator layer, the first metal via contacting the oxide of the further metal layer in the first region;

forming a second metal via within the insulator layer, the second metal via contacting the fourth metal interconnect in the third region; and forming a fifth metal interconnect and a sixth metal interconnect over the insulator layer, wherein the fifth metal interconnect contacts the first metal via and the sixth metal interconnect contacts the second metal via, wherein the fifth metal interconnect and the sixth metal interconnect comprise the further metal, wherein the first metal interconnect, the oxide of the further metal layer in the first region, and the first metal via form a MIM capacitor, wherein the unconverted further metal layer in the second region forms a resistor, and wherein the second metal via forms an electrical contact to the fourth metal interconnect.

18. A method for forming a device, the process comprising:

forming a first metal interconnect in a first region, a second metal interconnect and a third metal interconnect in a second region, and a fourth metal interconnect in a third region, by depositing a metal comprising copper using a damascene process, wherein the first, the second, the third, and the fourth metal interconnects are embedded in an insulator over a substrate and provided with a diffusion barrier at sidewalls of the first, the second, the third, and the fourth metal interconnects;

forming a further metal layer comprising a further metal as a blanket layer over the substrate using a plasma vapor deposition process, the further metal layer contacting the metal comprising copper, the further metal comprising a material selected from Ti, Ta, Hf, Nb, Zr, Ru, Rh, and Ir;

forming a silicon oxide or silicon nitride layer covering the further metal layer in the second region;

converting all of the further metal layer in the first region and the third region to form an oxide of the further metal layer without converting the underlying metal comprising copper;

forming a silicon nitride layer over the first, the second, the third, and the fourth metal interconnects, the silicon nitride layer covering the oxide of the further metal layer in the first region, the silicon oxide or silicon nitride layer in the second region;

forming a first metal via within the silicon nitride layer, the first metal via contacting the oxide of the further metal layer in the first region;

forming a second metal via within the silicon nitride layer, the second metal via contacting the fourth metal interconnect in the third region; and forming a fifth metal interconnect and a sixth metal interconnect over and contacting the silicon nitride layer, wherein the fifth metal interconnect contacts the first metal via and the sixth metal interconnect contacts the second metal via, wherein the fifth metal interconnect and the sixth metal interconnect comprise the further metal, and wherein the first metal interconnect, the oxide of the further metal layer in the first region, and the first metal via form a MIM capacitor, wherein the further metal layer covered by the silicon oxide or silicon nitride layer in the second region forms a resistor, and wherein the second metal via forms an electrical contact to the fourth metal interconnect.

* * * * *